United States Patent [19]

Fujihara

[11] Patent Number: 5,532,949
[45] Date of Patent: Jul. 2, 1996

[54] BARREL SHIFTER

[75] Inventor: Shiro Fujihara, Tokyo, Japan

[73] Assignee: NEC Corporation, Tokyo, Japan

[21] Appl. No.: 365,448

[22] Filed: Dec. 28, 1994

[30] Foreign Application Priority Data

Dec. 28, 1993 [JP] Japan ..................... 5-336204

[51] Int. Cl.[6] .............. G06F 7/00; G06F 15/00; G11C 19/00
[52] U.S. Cl. .............. 364/715.08; 377/64; 341/67; 341/95
[58] Field of Search ................ 364/715.01, 715.08; 341/60, 67, 81, 95; 377/64, 69

[56] References Cited

U.S. PATENT DOCUMENTS

| | | | |
|---|---|---|---|
| 4,827,441 | 5/1989 | Someshwar et al. | 364/715.08 |
| 5,146,220 | 9/1992 | Ishikawa | 341/67 |
| 5,465,222 | 11/1995 | Seekova | 364/715.08 |
| 5,465,223 | 11/1995 | Nishimura | 364/715.08 |

FOREIGN PATENT DOCUMENTS

59-57576  4/1984  Japan.
3-255723  11/1991  Japan.

*Primary Examiner*—Roy N. Envall, Jr.
*Assistant Examiner*—Emmanuel L. Moise
*Attorney, Agent, or Firm*—Foley & Lardner

[57] ABSTRACT

The barrel shifter of the present invention comprises a latch circuit of (m+n) bit, a register for indicating an effective bit length retained in the latch circuit, a selector for connecting the variable length code of maximum n bit with the latch circuit and a counting circuit for counting shifting number. In this invention, the latch circuit is divided by k bit, and the selector is controlled so as to shift bits of difference between the value lastly shifted and the value of the register, and data is retained at the latch circuit. When the value of register exceeds m, the selector outputs m bits to the latch circuit and the data at the latch circuit is shifted m bits.

6 Claims, 7 Drawing Sheets

STATUS 1
- CODE LATCH: 0 0 0 0 0 1 0 1 X X X X X X X X X X X X X X X X X
- DATA LATCH: 0 0 0 0 0 1 0 1 X X X X X X X X X X X X X X X X X
- OUTPUT LATCH: X X X X X X X X X X X X X X X X X X X X X X X X X

STATUS 2
- CODE LATCH: 0 0 1 0 0 1 X X X X X X X X X X X X X X X X X X X
- DATA LATCH: 0 0 0 0 0 1 X 0 0 1 X X X X X X X X X X X X X X X
- OUTPUT LATCH: X X X X X X X X X X X X X X X X X X X X X X X X X

STATUS 3
- CODE LATCH: 0 0 1 0 0 1 X X X X X X X X X X X X X X X X X X X
- DATA LATCH: 0 0 0 0 0 1 0 1 0 0 1 X X X X X X X X X X X X X X
- OUTPUT LATCH: X X X X X X X X X X X X X X X X X X X X X X X X X

STATUS 4
- CODE LATCH: 0 0 1 0 0 1 X X X X X X X X X X X X X X X X X X X
- DATA LATCH: 0 1 X X X X X X X 0 0 1 X X X X X X X X X X X X X
- OUTPUT LATCH: 0 0 0 0 0 1 0 1 0 0 1 0 X X X X X X X X X X X X X

| OUTPUT OF SHIFT REGISTER107 | OUTPUT OF ALU111 | OUTPUT OF ALU113 |
|---|---|---|
| 0 0 0 0 | 0 0 0 | 0 0 |
| 0 0 0 1 | 0 0 1 | 1 1 |
| 0 0 1 0 | 0 0 1 | 1 0 |
| 0 0 1 1 | 0 0 1 | 0 1 |
| 0 1 0 0 | 0 0 1 | 0 0 |
| 0 1 0 1 | 0 1 0 | 1 1 |
| 0 1 1 0 | 0 1 0 | 1 0 |
| 0 1 1 1 | 0 1 0 | 0 1 |
| 1 0 0 0 | 0 1 0 | 0 0 |
| 1 0 0 1 | 0 1 1 | 1 1 |
| 1 0 1 0 | 0 1 1 | 1 0 |
| 1 0 1 1 | 0 1 1 | 0 1 |
| 1 1 0 0 | 0 1 1 | 0 0 |
| 1 1 0 1 | 1 0 0 | 1 1 |
| 1 1 1 0 | 1 0 0 | 1 0 |
| 1 1 1 1 | 1 0 0 | 0 1 |

| | SHIFT REGISTER 508 | COUNTER 506 | COUNTER 507 |
|---|---|---|---|
| INITIAL STATUS | x x x x x x x x x x x x x | 0 0 0 0 | 0 0 0 0 0 |
| STATUS 1 | x x x x x x x x x 1 1 1 1 | 0 1 1 1 | 1 0 0 0 0 |
| STATUS 2 | 1 1 0 0 1 1 1 1 1 0 0 1 0 | 1 0 0 0 | 0 1 1 1 0 |
| STATUS 3 | 1 1 0 0 1 1 1 1 1 0 0 1 0 | 0 0 0 0 | 0 1 1 1 0 |
| STATUS 4 | 0 0 1 1 1 1 1 0 0 1 0 0 1 | 0 0 1 0 ← CARRY BIT | 1 0 0 0 0 ← CARRY BIT |

BARREL SHIFTER

BACKGROUND OF THE INVENTION

The present invention relates to a barrel shifter which shifts input data by an amount allocated thereto.

In facsimile signals, original picture images are encoded at a sender side for transmission, and the received codes are decoded at a receiver side. In this processing, the number of white picture elements is counted as a white run length similarly black picture elements a black run length. Then specific codes are allocated to these run lengths depending on the numbers. This code is shortened as its occurrence frequency increases. This remarkably reduces substantial amount of data. Since those codes are variable bit length data which often cause inconvenience in processing, they must be arranged to have a predetermined length.

In JPEG as an international standard for still picture compression, and in MPEG as an international standard for motion picture compression, data are quantized after DCT conversion so as to bind a number of continuation of effective factor that is 0 and effective factors that are not 0 to be encoded to form a code data string. The resultant code data are also variable bit length data which are the same as those used in facsimile transmission. In order to arrange those variable bit length data to have a predetermined length, a barrel shifter is required.

Figure 6:
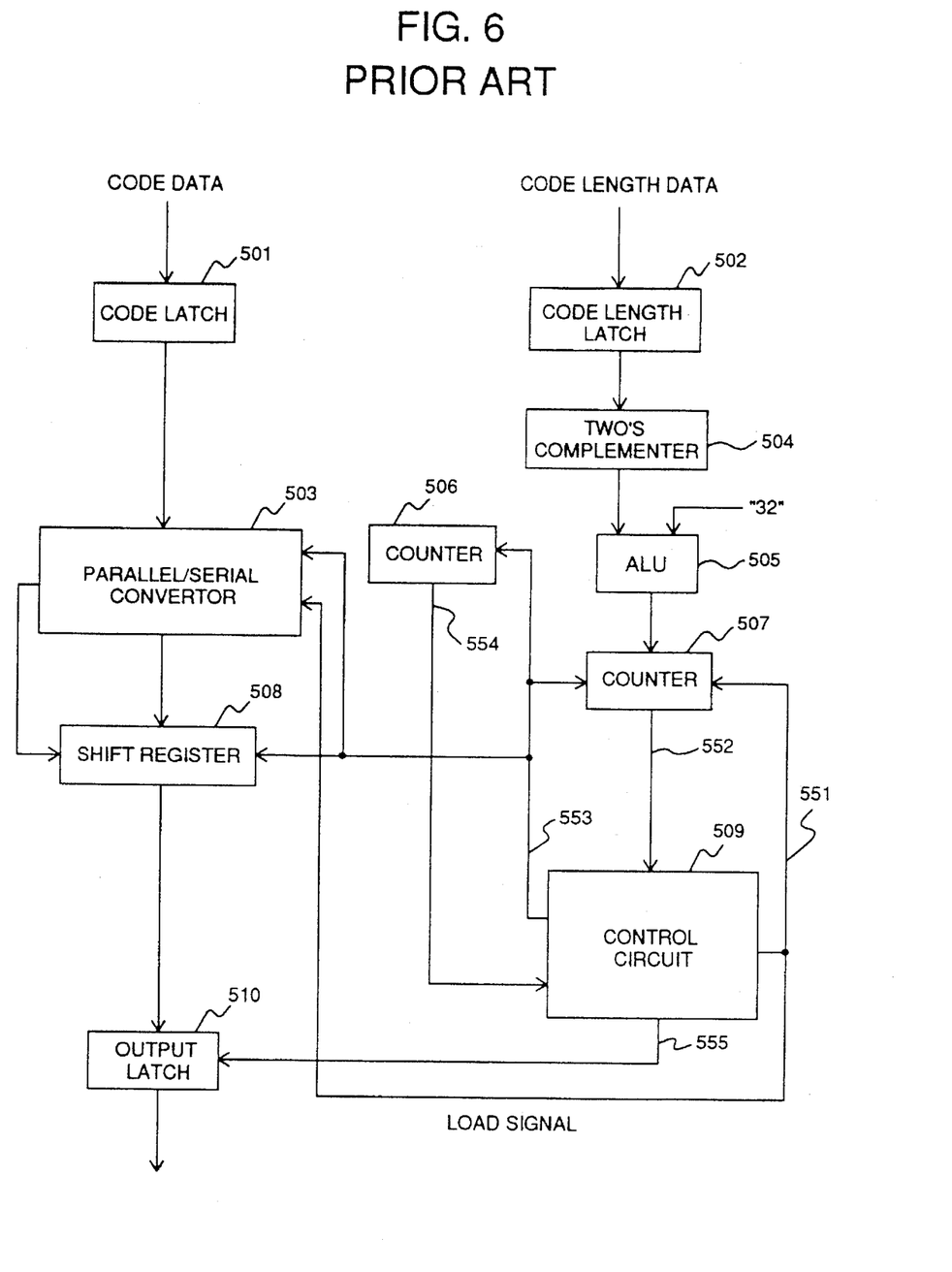
FIG. 6 is a schematic view of a structure of a prior barrel shifter circuit.
Figure 7:
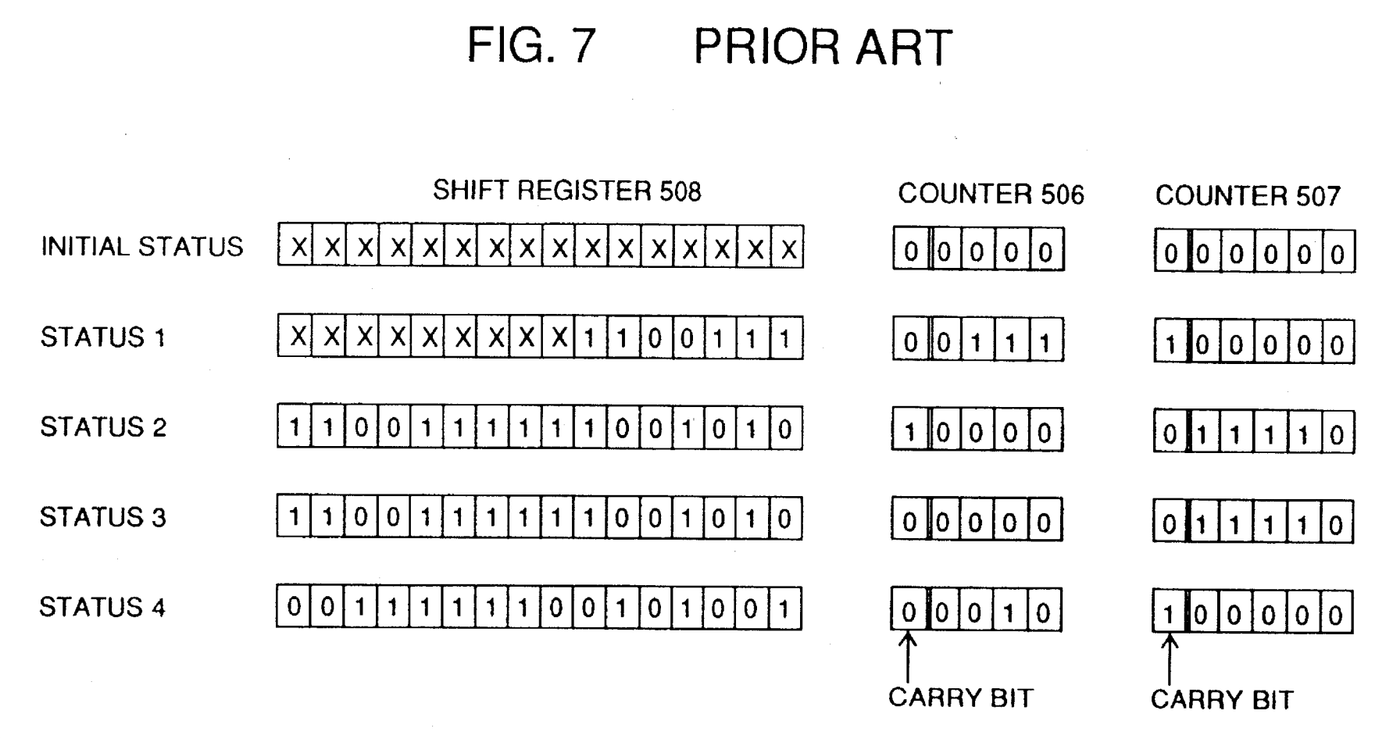
FIG. 7 is an explanatory view of the circuit operation in FIG. 6.

FIG. 6 shows an example of a prior barrel shifter circuit. Its function is explained assuming the maximum bit number of the code data to be input is 16 bit, and the predetermined data length to be output is 16 bit. FIG. 7 shows respective status of a shift register 508, and counters 506 and 507.

At the initial status, the counter 507 is set at 0. Supposing that "1100111" is input as the first code data, a code latch 501 retains this code data. This has a length of 7 bit, thus "7" is retained at a code length latch 502. The output from the code length latch 502 is loaded to the counter 507 through ALU 505 where calculation 32−7=25 is performed, synchronizing with a load signal 551. Therefore, the value of the counter 507 immediately after loading is 25.

The code data retained in the code latch 501 is loaded to a parallel/serial converter 503, synchronizing with the load signal 551. The counter 507 is constructed so as to set a carry signal 552 at "1" when its value becomes 32. It continue to input a clock 553 until the carry signal 552 is set at 1. While the carry signal 552 is set at 1, the shift register 508 retains input data up to 7-th bit from the LSB. The counter 506 indicates the value of 7. This is shown as the status 1 in FIG. 7. Since the value of the counter 506 has not reached 16, the carry signal 554 does not become "1".

Next, supposing that "11100101001" is input as the second code data, the value processed through calculation 32−11=21 is loaded to the counter 507, synchronizing with the load signal 551. The carry signal 554 of the counter 506 is set at "1" by inputting the clock 553. The operation of the counter 507 is suspended by a control circuit 509. This is shown as the status 2 in FIG. 7.

At this time, a latch signal 555 is output to an output latch 510 and data of the shift register 508 are latched. The counter 506 is reset at this stage. This is shown as the status 3 in FIG. 7. Then the counter 507 resumes its operation until the carry signal 552 is set at "1". When the carry signal 552 has become "1", the value of the counter 506 is 2, indicating that the data has been input up to the second bit from the LSB of the shift register 508. This is shown as the status 4 in FIG. 7.

With the above-described structure, for example, processing 11 bit code data requires 11 clocks, thus hindering high-speed processing. Japanese Patent Laid-Open No.57576 (1978) discloses the use of a shift circuit provided with 2 or 1 bit shift function to solve such a problem. This circuit has a relatively simple structure, however, the longer the code data bit length becomes, the more processing time (number of clocks) is required. Accordingly it fails in providing a solution for the high-speed processing. The other Japanese Patent Laid-Open No.25572B (1991) discloses 1 clock shift function. In this case, the circuit size is required to be larger with increase in the bit length of the code to be input, which is not suitable for LSI applications.

SUMMARY OF THE INVENTION

Considering the aforementioned problems, it is an object of the present invention to keep the circuit size as small as possible, and realize high speed shift processing even if the bit length of code data is increased.

The above-mentioned object of the present invention is achieved by a barrel shifter that inputs a variable length code data made of maximum n bit and outputs it as a fixed length data of m bit, the barrel shifter comprising: a data latch means for latching an (n+m) bit data; a shift control register for indicating an effective bit length retained in the data latch means; a data selector for connecting the variable length code data with the data latch means; a counting means for counting shift amount by each one bit; a first means for logically dividing the data latch means by k bit, controlling the data selector so as to shift a minimum value that exceeds a value of the shift control register in a integer multiple of the logically divided k as a first stage shifting, and retaining a data in the data latch means; a second means for controlling the data selector so as to shift by each one bit for differences between a shifted value in the first stage and a value of the shift control register as a second stage shifting and retaining a data in the data latch latch means; and a third means for controlling the data selector so as to output m bit of the shift control register when a value of the shift control register exceeds m and shift a data retained in the data latch means m bit and retaining a data.

The present invention configured as above divides the data latch means into pieces of k bit, controls the data selector so as to shift bits of differences between a bit number lastly shifted and a value of the shift register, and retains a resulted data in the data latch means. And it outputs m bits when the value of the shift register has exceeded m and shifts data in the data latch means m bits.

As described above, the present invention keeps the circuit size of the barrel shifter minimum by increasing the bit number of logic partition in spite of the increase of the maximum length of the code data with variable bit length, resulting in facilitating LSI applications.

This and other objects, features and advantages of the present invention will become more apparent upon a reading of the following detailed description and drawings.

DESCRIPTION OF THE PREFERRED EMBODIMENTS

Figure 1:
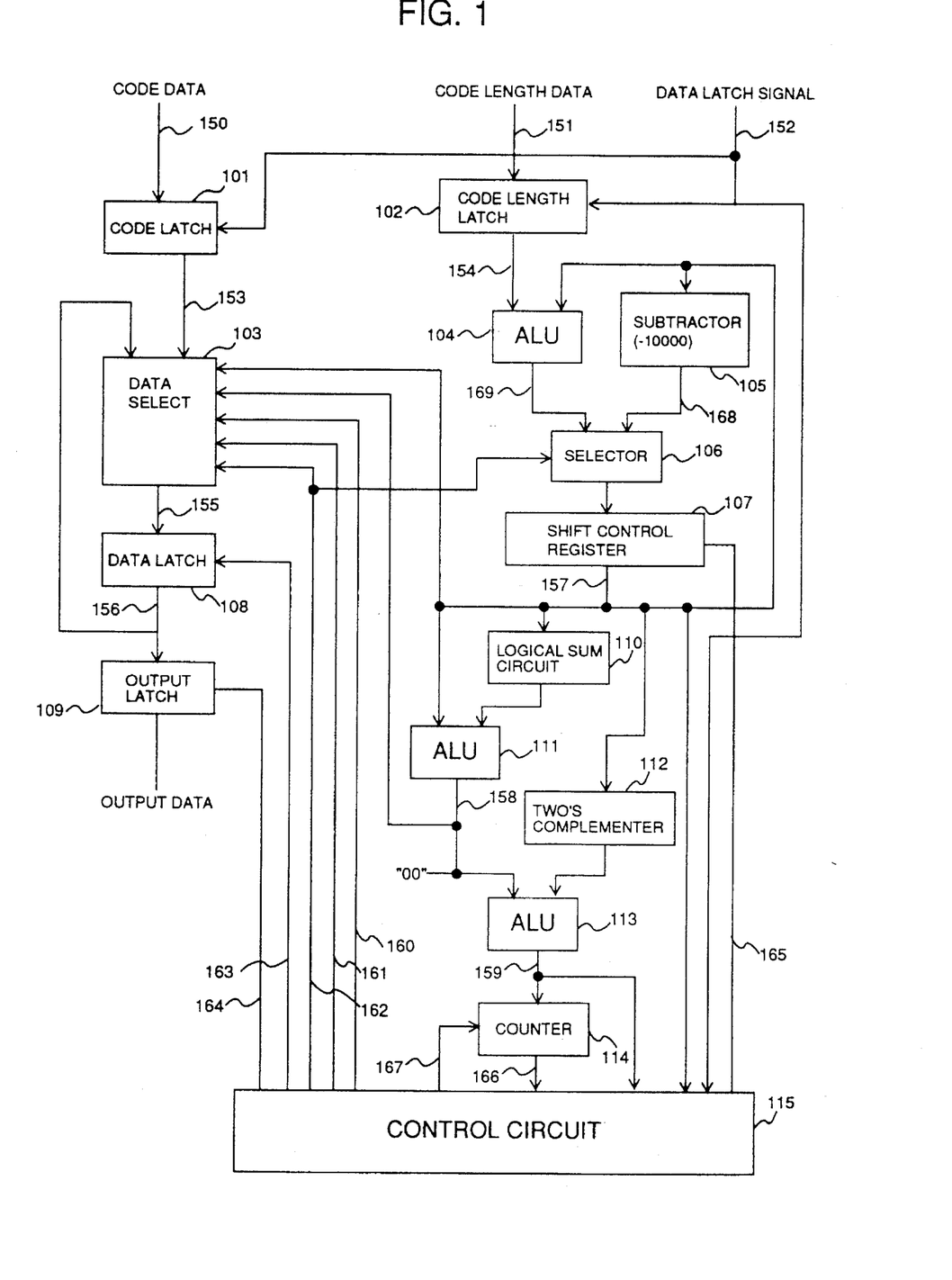
FIG. 1 is a block diagram representing an embodiment of the present invention.

The present invention is explained referring to the drawings. FIG. 1 is a block diagram representing an embodiment of the present invention. In the following description, it is assumed that n=16, m=16 and k=4, and each value is expressed in binary number.

A data latch signal 152 from the last stage is retained at a code latch 101 and a code length latch 102, respectively. A code data 150 with variable bit length is retained at a code latch 101. A code length data 151 indicating bit number of the code data 150 is retained at a code length latch 102.

An ALU 104 adds the bit number of the currently input code data to the bit number of the effective data retained at a data latch 108 up to the last shift processing, and outputs a result. This value represents a bit number of the data retained at the data latch 108 resulted from the shift processing of the currently input code data.

A subtracter 105 subtracts the value "10000" from the value of an output 157 of a shift control register 107. The output 168 of the subtracter 105 represents a bit number of effective data remained at the data latch 108 after latching 16 bit data to an output latch 109.

The shift control register 107 is configured by 5 bit latch. The output of 5 bit represents an effective bit number of the data retained in the data latch 108.

An input of an ALU 111 is an input of upper 3 bit of the output 157 of the shift control register 107 and another input thereof is an input of data resulted from adding "00" to a result of operating logical sum of the lower bit of the output 157 from the shift control register 107. The ALU 111 therefore receives an input of "000" only when the output 157 of the shift control register 107 is a multiple of 4, and an input of "001" otherwise. An output 158 of 3 bit from the ALU 111 is input to a data selector 103. This value determines the shift amount at the first stage.

An input of an ALU 113 is an input of 5 bit resulted from adding "00" of 2 bit to the LSB side of the output 158 of the ALU 111. Another input thereof is an input of the value obtained by calculating two's complement from the output of the shift control register 107. Then it is added to abovementioned 5 bit value that is added by 2 bit 37 00". The output 159 that is 2 bits at the LSB side of the result represents the shift frequency per 1 bit.

A counter 114 configured by 2 bit down counter performs down counting by loading the output 159 of the ALU 113, synchronizing with a load signal 167. As the output 159 of the ALU 113 represents the shift frequency per 1 bit, down counting is continued until the counter output becomes 0.

Figure 4:
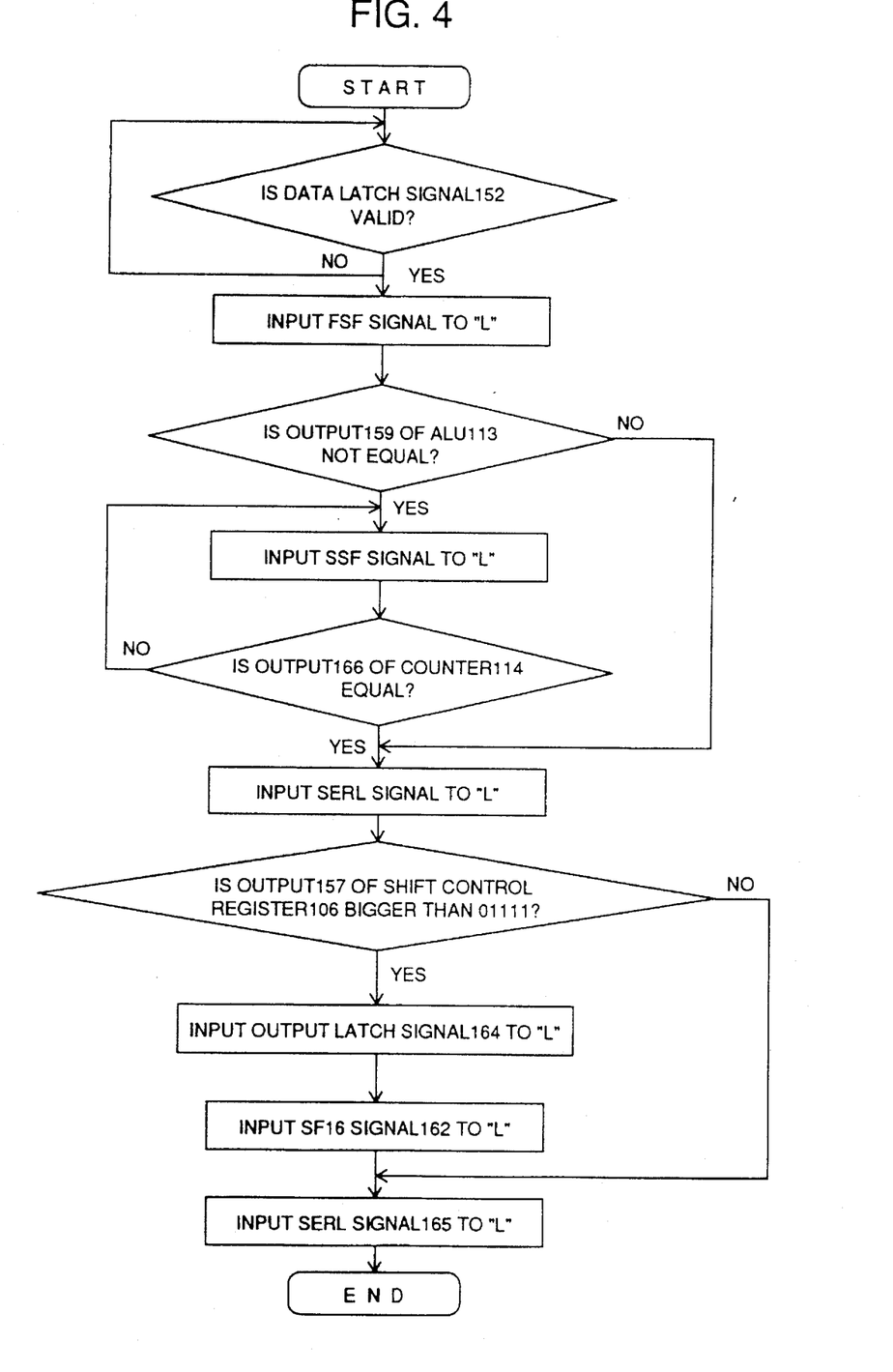
FIG. 4 is a flow chart representing processing of a control circuit.

If the output 159 of the ALU 113 is 0, a control circuit 115 does not perform 1 bit shift. If it is not 0, the control circuit 115 effectuate a second stage shift signal (hereinafter, referred to as SSF signal) 161 for 1 bit shifting. Since 1 bit shift frequency is counted by the counter 114, the control circuit 115 effectuates the SSF signal 161 until the output 166 of the counter 114 becomes "00". When it reaches "00", the SSF signal 161 is ineffective. When a shift control register latch signal (hereinafter, referred to as SFRL signal) 165 is made effective after making the SSF signal 161 ineffective, the effective data bit number currently retained at the data latch 108 is latched to the shift control register 107. If this value exceeds "10000", the control circuit 115 effectuates output latch signal 164, 16 bit shift signal (hereinafter, referred to as SF16 signal) 162, and SFRL signal 165. The data of 16 bit are latched to the output latch 109, and the value shifted by 16 bit is latched to the data latch 108. As the SF16 signal 162 becomes effective, the shift control register 107 receives an input of the value resulted from subtracting "10000" from a value currently retained at the shift control register 107. The value is latched to the shift control register 107 since the SFRL signal 165 is effective. FIG. 4 shows the control flow of the control circuit 115.

Figure 5:
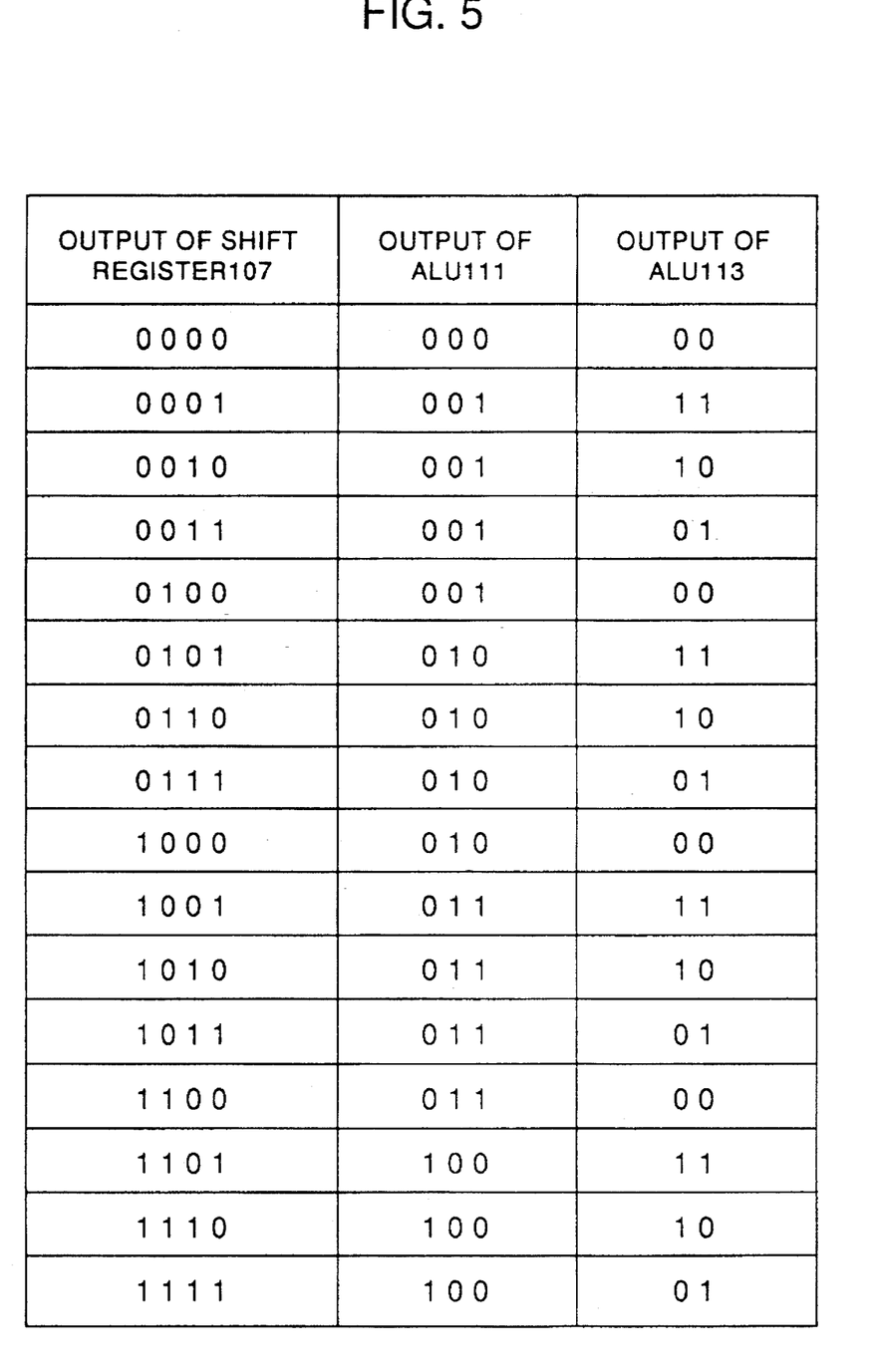
FIG. 5 is a view representing a relationship between a shift control register and ALUs.

FIG. 5 shows 3 bit output value of the ALU 111 and 2 bit output value of the ALU 113 corresponded to each output value of the shift control register 107.

A data selector 103 controls the output 153 from the code latch 101 and the output 156 from the data latch 108, by using the output 157 of the shift control register 107, the output 158 of the ALU 111, a first stage shift signal (hereinafter, referred to as FSF) 160 of the control circuit 115, SSF signal 161 and SF16 signal 162 and outputs the latch data 155 to the data latch 108.

Next, specific operations of the present embodiment is explained.

Figure 2:
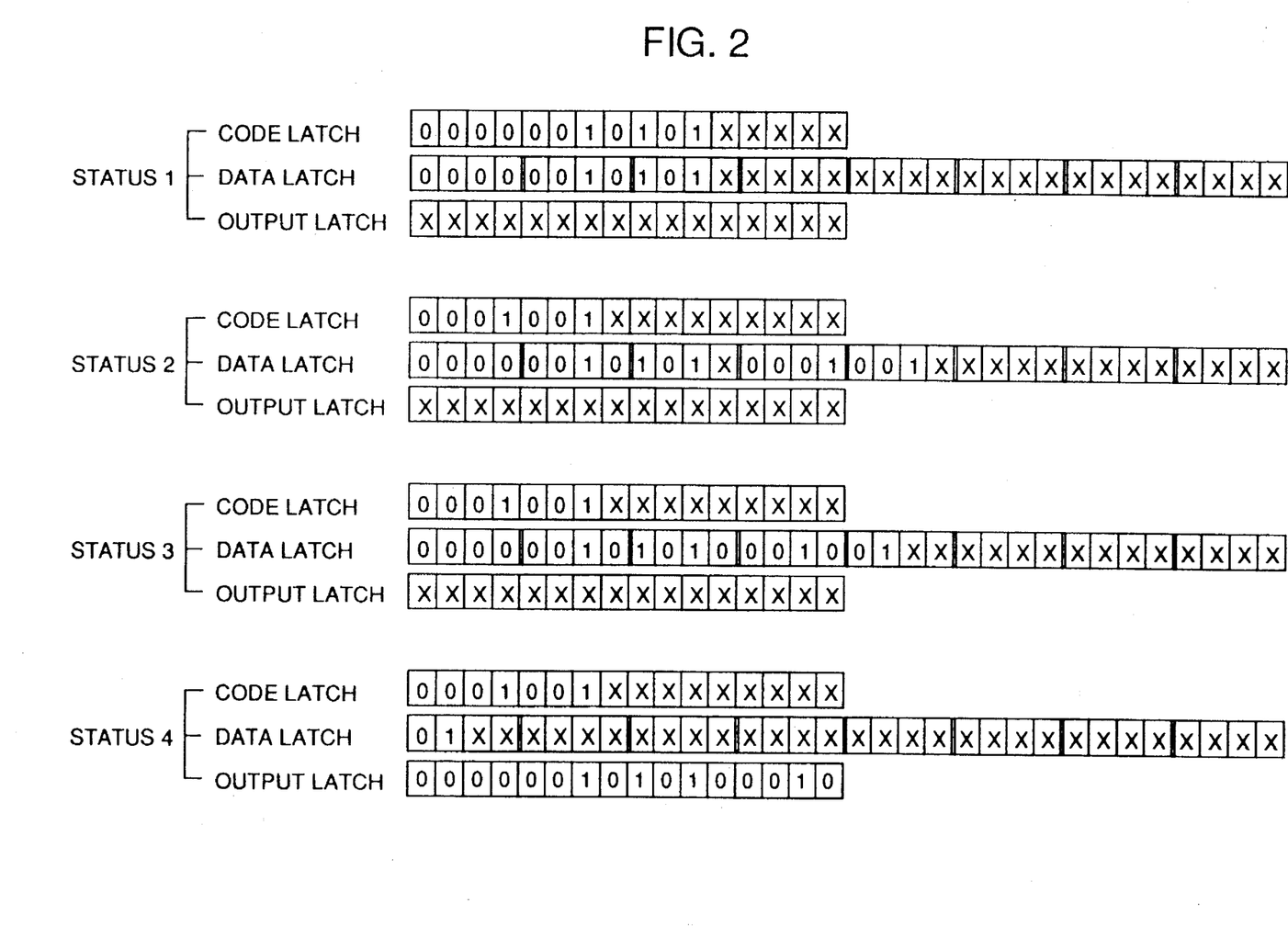
FIG. 2 is an explanatory view of a circuit operation of FIG. 1.

The value of the shift control register 107 is assumed to be "00000" as its initial status, which will be described in detail referring to examples. FIG. 2 shows each internal status of the data latch 108, code latch 101 and output latch 109.

The first code data and its code length are assumed to be "00000010101" and "01011", respectively In the latch signal 152 from the last stage, the code "00000010101" is latched to the code latch 101, and the code length "01011" is latched to the code length latch 102. The output 169 of the ALU 104 becomes "01011". Referring to FIG. 5, as the output 157 of the shift control register 107 is "00000", the output 158 of the ALU 111 is "000", and the output 159 of the ALU 113 is "00". When having detected that the data latch signal 152 becomes effective, the control circuit 115 effectuates an FSF signal 160, and performs the first stage shift processing so as to be the status 1 shown in FIG. 2. Since the output 159 of the ALU 113 is "00", the second stage shifting is not performed. The SFRL signal 165 is effectuated and the output 169 of the ALU 104 is latched to the shift control register 107. As a result, the output 157 of the shift control register 107 becomes "01011".

The second code data and its code length are assumed to be "0001001" and "00111", respectively. In the latch signal 152 from the last stage, the code "0001001" is latched to the code latch 101, and the code length "00111" is latched to the code length latch 102. Since the output 157 of the shift control register 107 is "01011", the output 169 of the ALU 104 becomes "10010". Since the output 157 of the shift control register 107 is "01011", FIG. 5 shows that the output 158 of the ALU 111 is "011" and the output 159 of the ALU 113 is "01".

When having detected that the latch signal 152 becomes effective, the control circuit 115 effectuates the FSF signal 160 to perform the first stage shifting so as to be the status 2 as shown in FIG. 2. Since the output 159 of the ALU 113 is "01", the control circuit 115 effectuates the load signal 167 to load "01" to the counter 114.

The counter 114 then performs down counting. The control circuit 115 effectuates the SFS signal 161 once until the output 166 of the counter 114 becomes "00" to perform the second stage 1 bit shifting so as to be the status 3 shown in FIG. 2.

Continuously, the SFRL signal 165 is effectuated to latch the output 169 of the ALU 104 to the shift control register 107. As a result, the output 157 of the shift control register 107 becomes "10010". As it exceeds "10000", the control circuit 115 effectuates the output latch signal 164 to latch upper side 16 bit to the output latch 109. The SF16 signal 162 is effectuated concurrently and the data resulted from 16 bit shifting the output data 156 of the data latch 108 are input and latched to the data latch 108. As the SF16 signal 162 becomes effective, the selector 106 selects the output of the subtracter 105. The shift control register 107 receives an input of the value "00010" resulted from subtracting "10000" from "10010" to be latched thereto through the SFRL signal 165. As a result, it becomes the status 4 shown in FIG. 2. The output 157 of the shift control register 107 becomes "0010".

Figure 3:
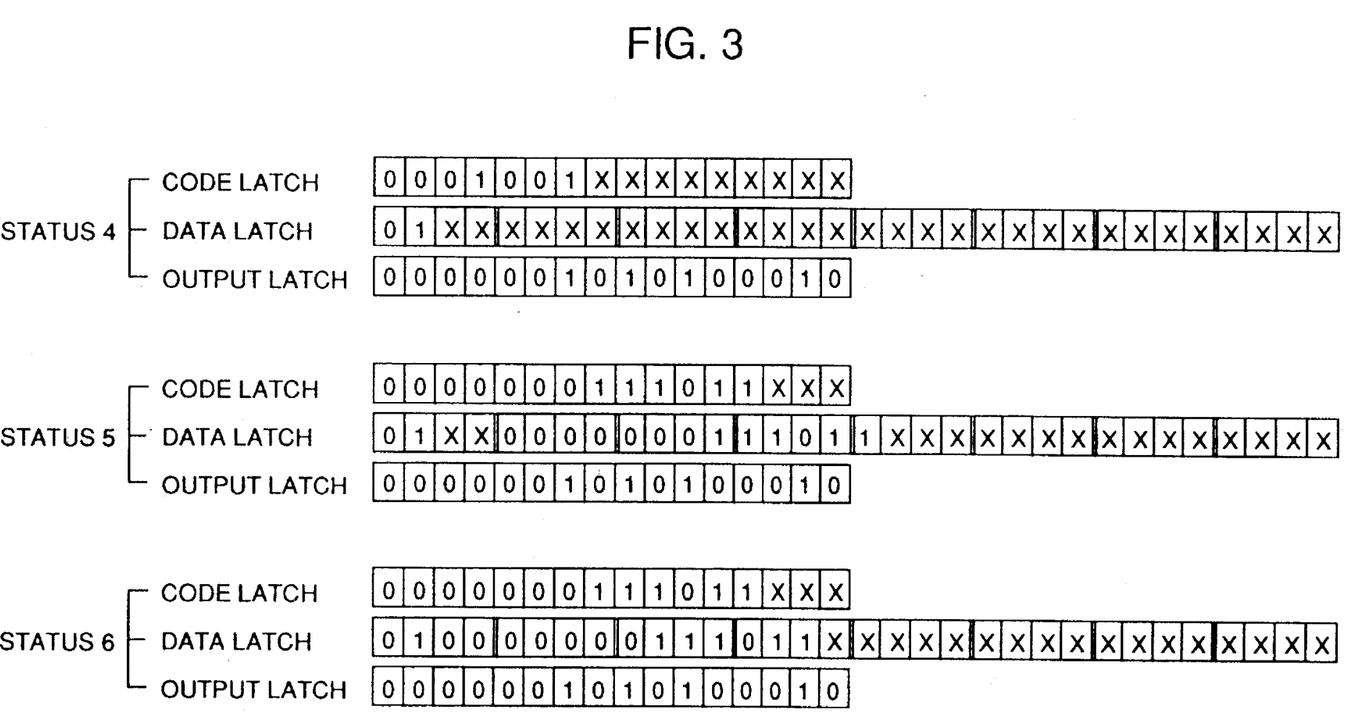
FIG. 3 is an explanatory view of the circuit operation of FIG. 1.

The third code data and its code length are assumed to be "0000000111011" and "01101", respectively. In the latch signal 152 from the last stage, the code "0000000111011" is latched to the code latch 101 and the code length "01101" is latched to the code length latch 102. As the output 157 from the shift control register 107 becomes "00010", the output 169 of the ALU 104 is "01111". As the output 157 of the shift register 107 is "0010", FIG. 5 shows that corresponded output 158 of the ALU 111 is "001", and the output 159 of the ALU 113 is "10". When having detected that the latch signal 152 becomes effective, the control circuit 115 effectuates the FSF signal 160 to perform the first stage shifting so as to be the status 5 shown in FIG. 3. Since the output 159 of the ALU 113 is "10", the control circuit 115 loads "10" to the counter 114 by effectuating the load signal 167. Then the counter 114 starts down counting and effectuates the SFS signal 161 twice until the output 166 of the counter 114 becomes "00" to perform the second stage 1 bit shifting so as to be the status 6 shown in FIG. 3. The SFRL signal 165 is effectuated to latch the output 169 of the ALU 104 to the shift control register 107. As a result, the output 154 of the shift control register 107 becomes "01111".

Although the description of this embodiment assumes k=4, the same function can be obtained with k=2. In such a case, the output from the ALU 111 becomes 4 bit, and the counter 114 is a 1 bit counter. In spite of increased maximum length of the variable bit length code data, the circuit size can be kept minimized by increasing the value k, resulting in facilitating LSI applications.

What is claimed is:

1. A barrel shifter that inputs a variable length code data made of maximum n bit and outputs it as a fixed length data of m bit, the barrel shifter comprising:

a data latch means for latching an (n+m) bit data;

a shift control register for indicating an effective bit length retained in said data latch means;

a data selector for connecting said variable length code data with said data latch means;

a counting means for counting shift amount by each one bit;

a first means for logically dividing said data latch means by k bit, controlling said data selector so as to shift a minimum value that exceeds a value of said shift control register in an integer multiple of the logically divided k as a first stage shifting, and retaining a data in said data latch means;

a second means for controlling said data selector so as to shift by each one bit for differences between a shifted value in said first stage and a value of said shift control register as a second stage shifting and retaining a data in said data latch means; and a third means for controlling said data selector so as to output m bit of said shift control register when a value of said shift control register exceeds m and shift a data retained in said data latch means m bit and retaining a data.

2. The barrel shifter of claim 1, further comprising a means for varying a logically divided value k.

3. The barrel shifter of claim 1, wherein said first means comprising:

a logical-OR circuit for operating logical-OR of output of said shift control register; and a first arithmetic and logic unit for calculating a shift amount at the first stage based on an output of said logical-OR circuit and an output of said shift control register.

4. The barrel shifter of claim 1, wherein said second means comprising:

a complementer for calculating two's complement of an output of said shift control register; and a first arithmetic and logic unit for calculating a number of shifting based on an output of said complementer and a shift amount at the first stage.

5. The barrel shifter of claim 1, wherein said third means comprising a controlling means for controlling said data selector based on a shift number of said counting means.

6. The barrel shifter of claim 1, further comprising a code data latch means for latching said variable length code data; and a code length data latching means for latching code length data representing bit number of said variable length code data.

* * * * *